United States Patent [19]

Spratte et al.

[11] Patent Number: 5,298,727
[45] Date of Patent: Mar. 29, 1994

[54] DEVICE FOR READING BAR CODES ON SEMICONDUCTOR SURFACES

[75] Inventors: Hans-Hermann Spratte, Kirchheim/Teck; Norbert Aldiek, Schlierbach, both of Fed. Rep. of Germany

[73] Assignee: Leuze Electronic GmbH & Co., Owen-Teck, Fed. Rep. of Germany

[21] Appl. No.: 847,337

[22] Filed: Mar. 6, 1992

[30] Foreign Application Priority Data

Mar. 6, 1991 [DE] Fed. Rep. of Germany ....... 4107069

[51] Int. Cl.$^5$ ............................................. G06K 7/10
[52] U.S. Cl. ..................................... 235/462; 235/470; 235/463; 250/566
[58] Field of Search ............... 235/462, 463, 467, 470, 235/472; 250/550, 566, 568, 578.1; 360/59; 369/13

[56] References Cited

U.S. PATENT DOCUMENTS

| | | | |
|---|---|---|---|
| 4,567,361 | 1/1986 | Rosenthal | 235/462 |
| 4,585,931 | 4/1986 | Duncan et al. | |
| 4,603,262 | 7/1986 | Eastman et al. | 250/566 |
| 4,634,880 | 1/1987 | Lindow et al. | 250/566 |
| 4,794,238 | 12/1988 | Hampton | 235/462 |
| 4,806,774 | 2/1989 | Lin et al. | 250/550 |
| 4,825,093 | 4/1989 | Kiriseko et al. | 250/566 |
| 4,831,275 | 5/1989 | Drucker | 235/462 X |
| 4,896,034 | 1/1990 | Kiriseko | 250/271 |

FOREIGN PATENT DOCUMENTS 3418753 11/1984 Fed. Rep. of Germany .
3736288  5/1989 Fed. Rep. of Germany .

OTHER PUBLICATIONS

*Hamamatsu Catalog,* "Opto-semiconductors," Sep,. 1990, p. 8.

*Primary Examiner*—Donald Hajec
*Assistant Examiner*—T. N. Forbus, Jr.
*Attorney, Agent, or Firm*—Spencer, Frank & Schneider

[57] ABSTRACT

A device for reading a bar code applied to a semiconductor wafer includes a laser source producing a coherent diverging light beam along a first optical path. An optical transmit/receive (T/R) unit has a first focal point on the first optical path upstream of the optical T/R unit for producing collimated light downstream thereof. The coherent diverging light beam is focussed into the first focal point of the optical T/R unit so that a parallel light beam having a planar wavefront is created downstream of the optical T/R unit for scanning the bar code. A beam divider mirror is disposed optically between the optical T/R unit and the first focal point for allowing the light beam from the laser source to pass through the T/R unit and for allowing light reflected from the semiconductor surface through the T/R unit to pass into a second focal point of the T/R unit on a second optical path and on to an image plane of the T/R unit on the second optical path for imaging the bar code. Diffracted light from the bar code creates a local frequency spectrum having its zero order diffraction component in the focal plane of a first aperture at the second focal point. A second aperture is disposed in the image plane of the bar code spatially in front of a photosensitive light receiver.

10 Claims, 5 Drawing Sheets

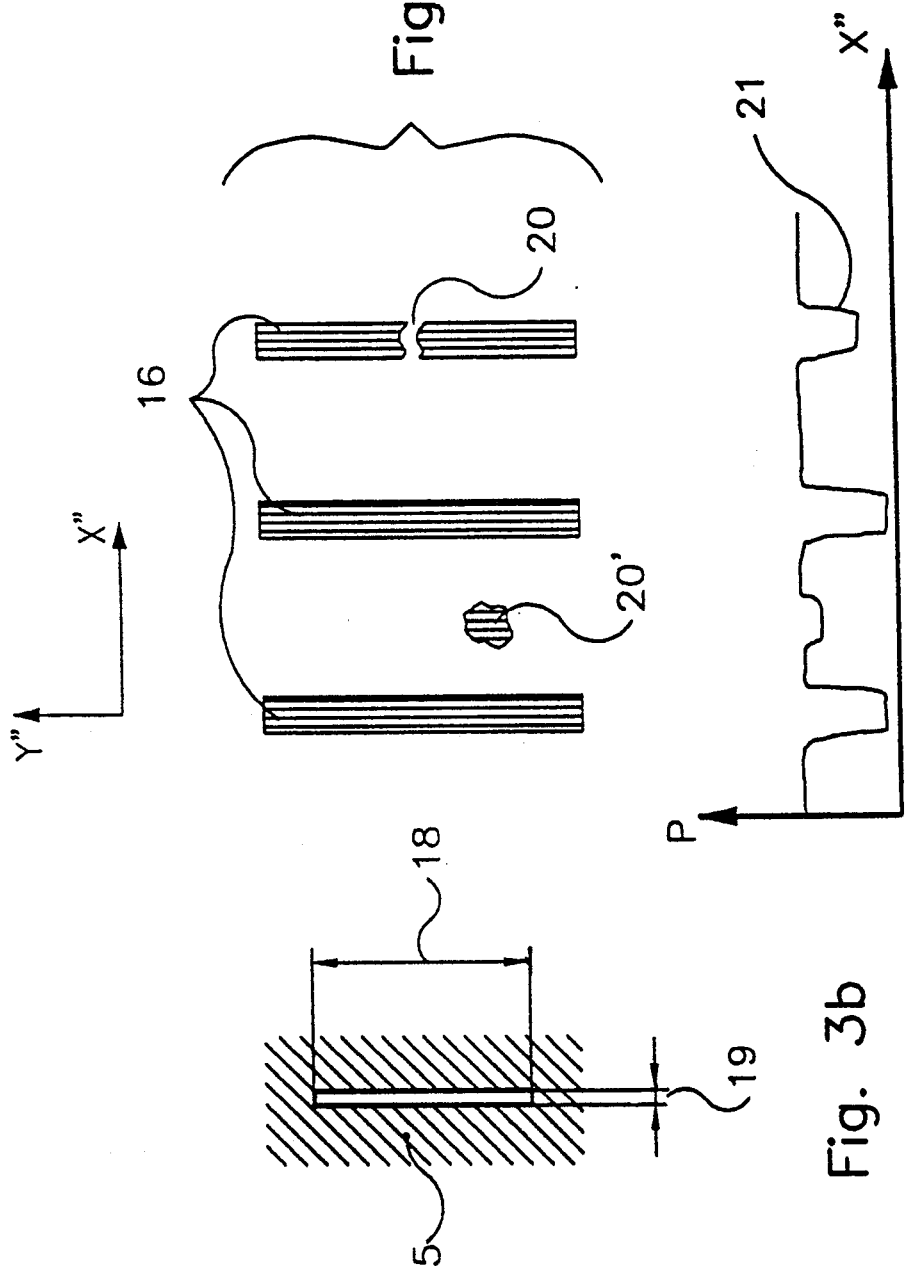

DEVICE FOR READING BAR CODES ON SEMICONDUCTOR SURFACES

CROSS REFERENCE TO RELATED APPLICATIONS

The present application claims the rights of priority with respect to application Serial No. P 41 07 069.0 filed Mar. 6th, 1991 in Germany, the subject matter of which is incorporated herein by reference.

BACKGROUND OF THE INVENTION

The present invention relates to a device for reading bar codes on semiconductor surfaces in which a laser beam is reflected off the semiconductor surface with the bar code and received by a receiving system including a photodiode.

U.S. Pat. No. 4,585,931 discloses a device for reading bar codes on semiconductor surfaces by means of an optical transmit/receive system having transmitting and receiving optical axes which enclose an angle of 180°−2Θ, with the angle Θ being formed between the semiconductor surface and the respective optical axis. The angle Θ is selectable over a range from approximately 30° to 60°. A light source, which is not identified in detail in the patent, beams a bundle of light onto the semiconductor surface at the angle Θ. This bundle of light is reflected at the angle Θ at the polished semiconductor surface or, more precisely, in the region of the gaps between the bar codes, and travels through a lens and an aperture system onto a photodetector. The photocurrent generated in the photodetector charges an amplifier whose output signal is fed to a decoder. The result of the decoding process is indicated on a display.

By rotation of the semiconductor disc, the bar code is moved past and underneath the transmit/receive system. The transmitted light is temporarily scattered at the micro-roughnesses of the bars.

The drawback is here that the aperture system including the lens at the receiving end has only a small aperture. Therefore, no or only a little light reaches the photodetector in the region of the micro-roughnesses. Moreover, the light source radiates incoherent light so that optical filtering of the light in order to raise contrast is not possible. Additionally, slopes in the semiconductor surface adversely affect the intensity of the received signal.

SUMMARY OF THE INVENTION

It is an object of the present invention to provide for optical filtering of the light and thus realize an increase in contrast as well as to eliminate slopes in the semiconductor surfaces which influence the intensity of the received signal.

The above and other objects of are accomplished in accordance with the invention by the provision of a device for reading a bar code applied to a surface of a semiconductor wafer, including: a laser beam source for producing a coherent diverging light beam along a first optical path optical transmit/receive means having a first focal point on the first optical path upstream of the optical transmit/receive means for producing collimated light downstream thereof; focussing means for focussing the coherent diverging light beam into the first focal point of the optical transmit/receive means so that a parallel light beam having a planar wavefront is created downstream of the optical transmit/receive means for scanning a semiconductor surface having a bar code thereon; a beam divider mirror disposed optically between the transmit/receive means and the first focal point for allowing the light beam from the laser beam source to pass through the transmit/receive means and for allowing light reflected from the semiconductor surface through the transmit/receive means to pass into a second focal point of the transmit/receive means on a second optical path and on toward an image plane of the transmit/receive means on the second optical path for imaging the bar code; first aperture means for creating a first aperture in a focal plane of said transmit/receive means at the second focal point, with diffracted light from the bar code creating a local frequency spectrum in the focal plane at the second focal point having its zero order diffraction component in the center of the first aperture; a photosensitive light receiver; and second aperture means for creating a second aperture in the bar code image plane spatially in front of the photosensitive light receiver.

The invention will now be described in greater detail with reference to the drawing figures.

BRIEF DESCRIPTION OF THE DRAWINGS

FIGS. 3a–c are an illustration of the effect of the rectangular aperture during reading of the bar code.

FIGS. 5a-1 to 5a-3 shows the semiconductor surface in the ideal position and the resulting diffraction image and detection signal, respectively.

FIGS. 5b-1 to 5b-3 shows the semiconductor in an oblique position and the resulting diffraction image and detection signal, respectively.

FIGS. 5c-1 to 5c-3 show three possibilities for correcting the diffraction image into the center of the filter aperture as in FIG. 5a-1.

DETAILED DESCRIPTION OF PREFERRED EMBODIMENTS

Figure 1:
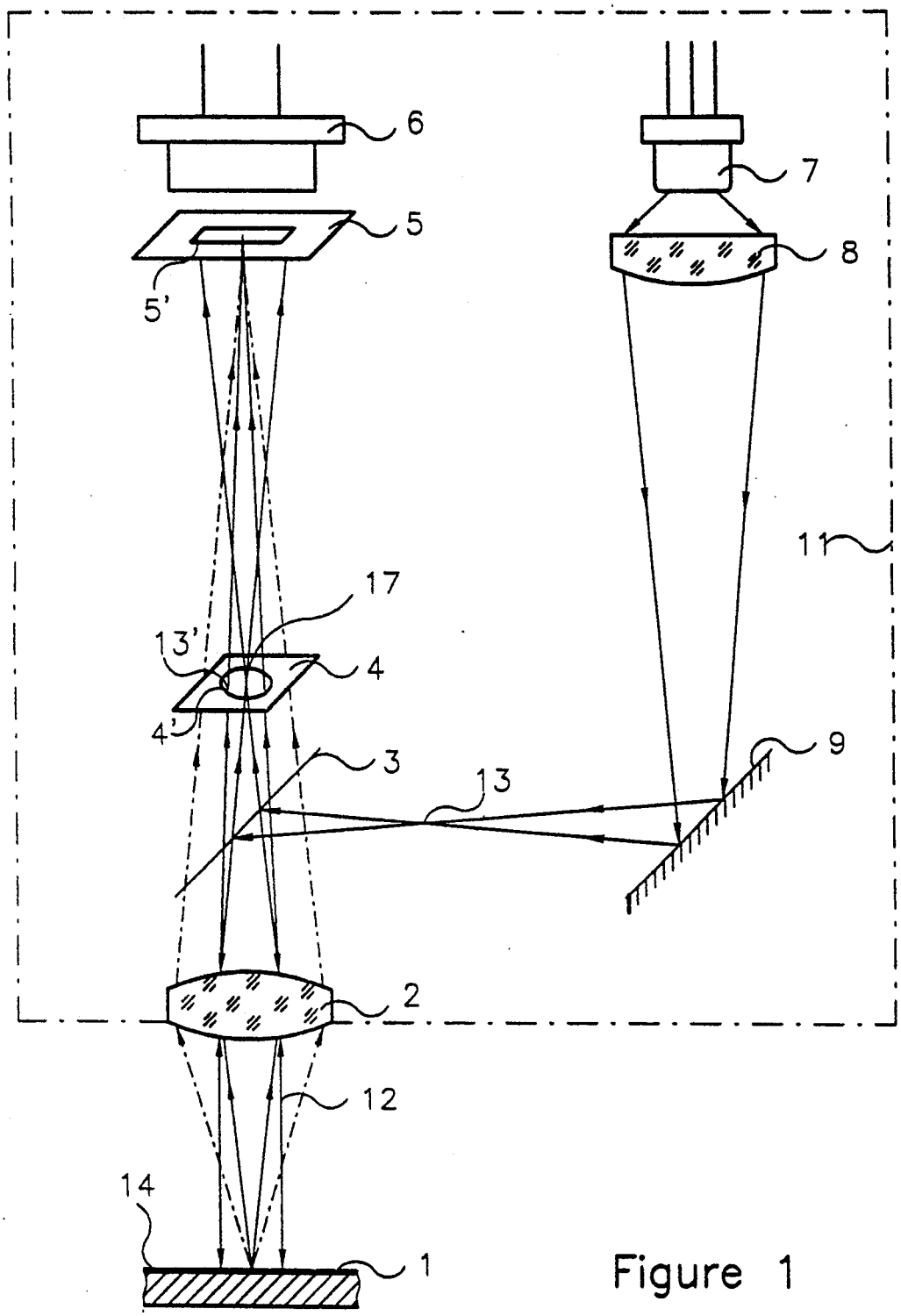
FIG. 1 is a schematic representation of the illuminating and imaging beam paths in a device according to the invention.

Referring to FIG. 1, there is shown a laser beam source 7 in the form of a laser diode which radiates a divergent bundle of coherent light. The wavelength of laser beam source 7 preferably lies within a range (750–830 μm) which does not include the sensitivity (300–600 μm) of a photoresist layer applied to a semiconductor surface 1 on which a bar code 14 is present.

The light from laser beam source 7 is diverted by a deflection mirror 9 and a beam divider 3 to pass through an optical transmit/receive unit 2, for example a collimating lens. Light from laser beam source 7 is focussed with the aid of a focusing lens 8 into a focal point 13 of optical transmit/receive unit 2 so that a parallel beam 12 is created downstream of optical transmit/receive unit 2 which impinges on semiconductor surface 1 as a coherent wavefront. As can be seen, beam divider mirror 3 is disposed between focal point 13 and optical transmit/receive unit 2.

Bar code 14 is applied to semiconductor surface 1, preferably by means of laser bombardment from a frequency doubled Nd-YAG laser so that a series of overlapping soft mark melt points are formed into a bar. The coherent wavefront incident on bar code 14 is reflected there and is subjected to phase as well as amplitude modulation. This light, whose amplitude and phase are changed, is received by optical transmit/receive unit 2 and is imaged, with the local frequency spectrum 15 (Fourier spectrum) of the diffracting bar code 14 being created in a focal plane 13' on the image side of transmit/receive unit 2 (see in this connection FIG. 2). In this embodiment, the optical path from laser beam source 7 to the semiconductor surface constitutes a first optical path, and the optical path from the semiconductor surface through focal plane 13' constitutes a second optical path.

In focal plane 13', which is also called the Fourier plane, there is provided an aperture plate 4 having a circular aperture 4'. The incorporation of an aperture in focal plane 13' prevents local frequency spectrum 15 and thus an image from appearing. The provision of circular aperture 4' centrally with respect to a zero order diffraction component 17 of the local frequency spectrum creates a lowpass filtering effect. That is, the higher frequency components of the local frequency spectrum 15 are blocked out and thus do not reach the photosensitive light receiver, for example, photodiode 6 which is disposed spacially behind a rectangular aperture 5' in an aperture plate 5. The local frequency filtered light thus travels through rectangular aperture 5' to photodiode 6. The output signal of photodiode 6 is fed to an amplifier (not shown) and is then decoded by an evaluation unit (also not shown). Photodiode 6 may comprise, for example, a large area PN or PIN diode based on silicon.

Figure 2:
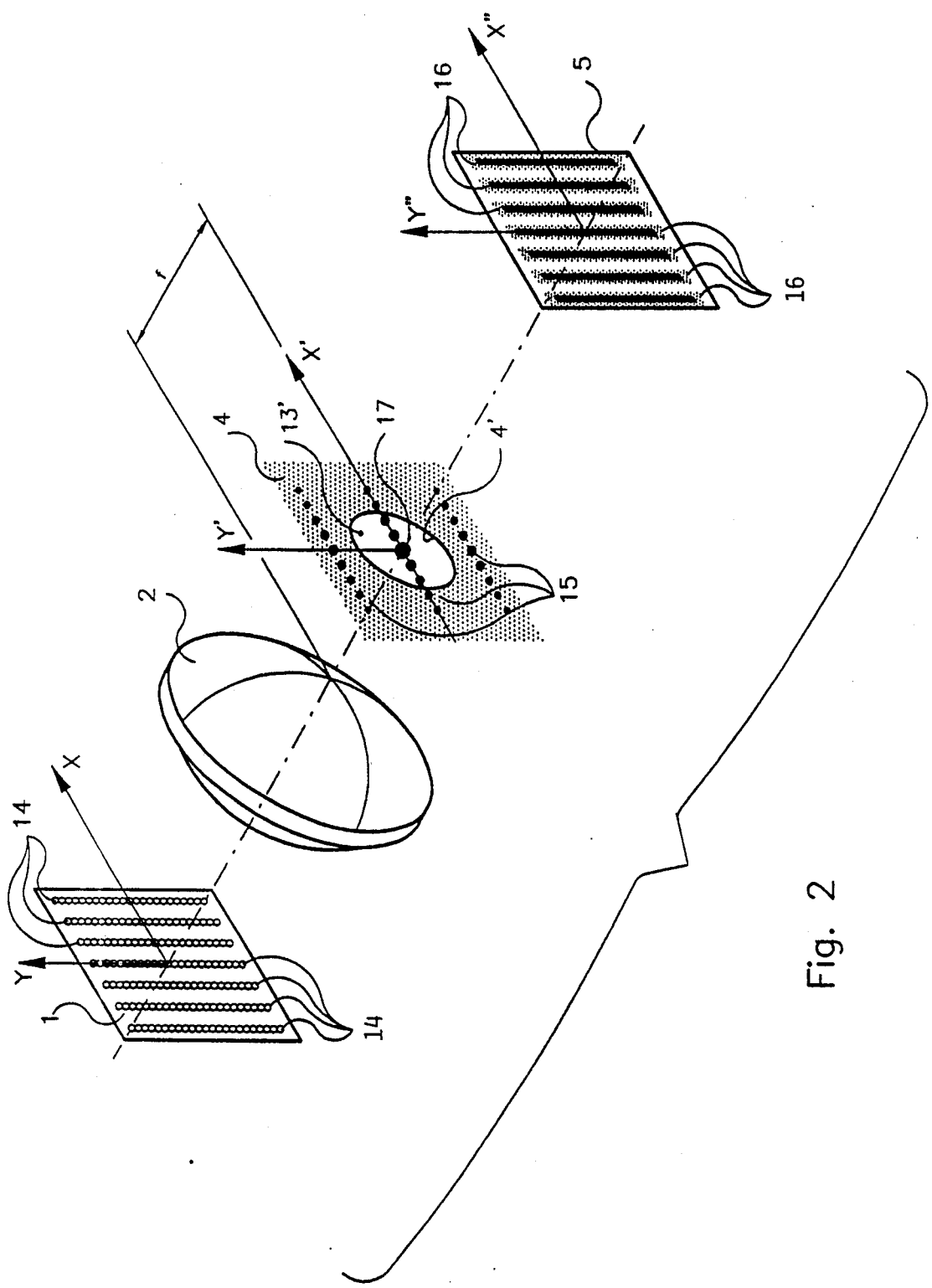
FIG. 2 is a perspective view of the arrangement including the bar code, optical system, filtering aperture, and the imaged and filtered bar code.

FIG. 2 shows the operation and effect of local frequency filtering in the received beam path. Bar code 14 is applied to semiconductor surface 1 with the direction of the bars being parallel to the Y axis. Bars 14 comprise periodic structures in the Y-direction and quasi-periodic structures in the X-direction. The light diffracted at bar code 14 is collected by means of optical transmit/receive unit 2 and appears in focal plane 13' as the local frequency spectrum 15. The zero order diffraction component 17 is disposed at the coordinate origin (X'=0, Y'=0) and simultaneously the center of the filter aperture 4'. The diameter of the hole in filter aperture plate 4 defines the cut-off frequency of the local frequency spectrum that is passed. Therefore, a filtered image 16 of the bar code appears on rectangular aperture 5' with the structures of bars 16 in the Y'''-direction disappearing and in the X'''-direction becoming "washed out." This method of filtering results in an increase in contrast.

The effect of the rectangular aperture 5' is shown in FIG. 3a. Referring to FIG. 3b, rectangular aperture 5' in aperture plate 5 has a ratio of its narrow side 19 to its broad side 18 of typically 1:40 to 1:80, with this ratio being a function of the geometry of the bar code 14 and of the imaging scale of optical transmit/receive unit 2. An image 16 of the bar code 14 appears on this rectangular aperture. If now a sensor 11 comprising the optoelectronic components within the dash-dot line of FIG. 1 is moved in the X direction relative to semiconductor surface 1, the image 16 travels in the X'' direction across rectangular aperture 5'. Thus there occurs an integral detector evaluation by means of photodiode 6 in the direction of the bars. As shown in FIG. 3c, the detected light energy 21 is a function of locus X'', and the integral evaluation prevents smaller interferences 20, 20' in the image 16 (see FIG. 3a) from being incorporated in the output signal of photodiode 6.

Figure 4:
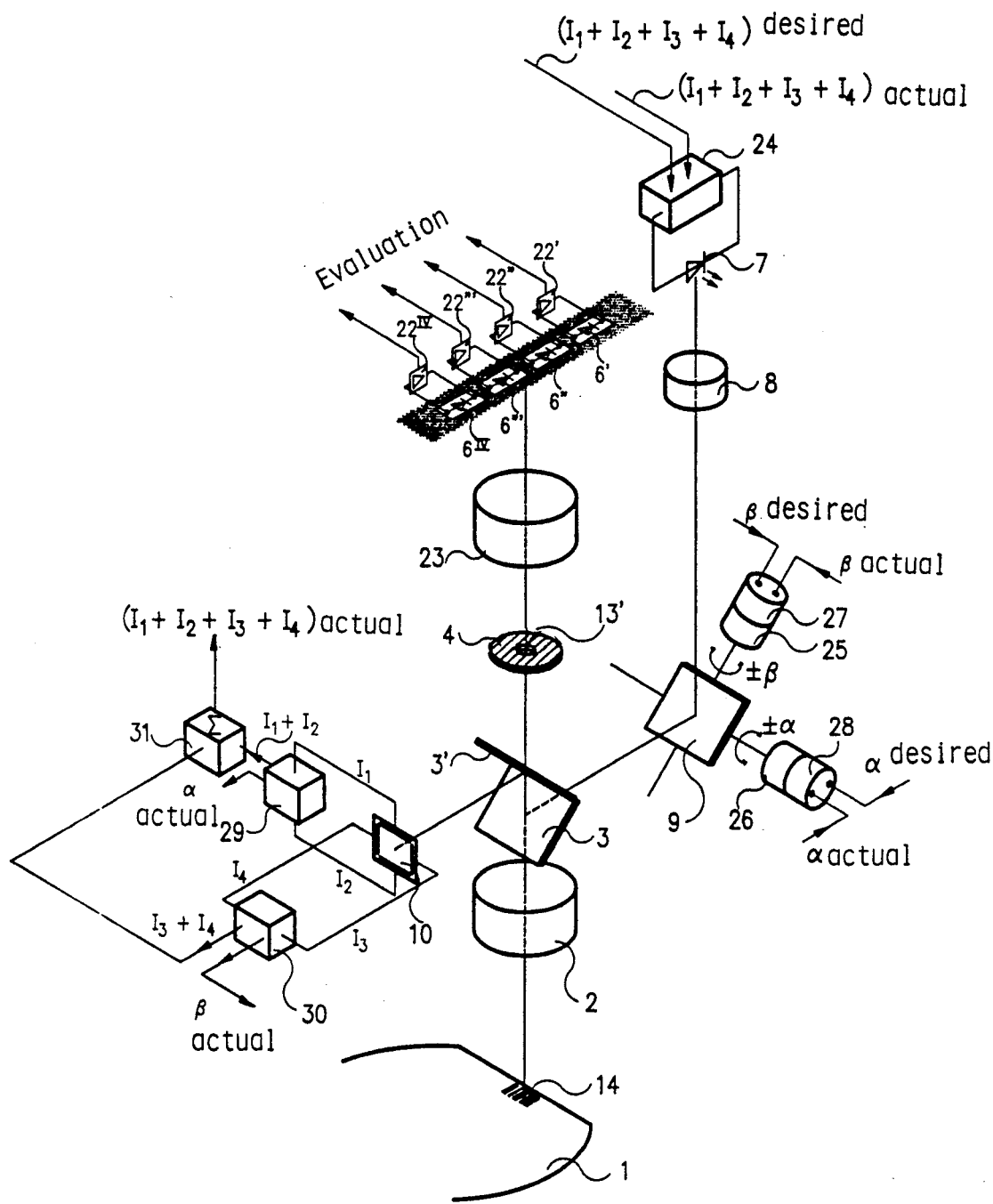
FIG. 4 shows an another embodiment a device according to the invention.

FIG. 4 shows a further embodiment of the invention in which (a) the slope of semiconductor surface 1 is automatically compensated within certain limits;

(b) at the same time, several scan traces are scanned by means of photodiodes 6' to 6$^{IV}$; and (c) the output signal of the photodiodes is caused to follow up independently of the light energy so that the output signal has sufficient amplitude even with a poorly reflecting semiconductor surface 1.

The arrangement shown in FIG. 4 corresponds, except for some details, to the arrangement of FIG. 1, with like elements being given the same reference numerals. Referring to FIG. 4, deflection mirror 9 is arranged to be movable about two rotation axes $\alpha$ and $\beta$, with the two rotation axes $(\alpha, \beta)$ being perpendicular to one another and the point of intersection of the rotation axes lying in the image plane of optical transmit/receive unit 2. Deflection mirror 9 is driven by an actuator 26 for rotation about axis $\alpha$ and an actuator 25 for rotation about axis $\beta$. Actuators 25 and 26 each have an associated electronic control 27 and 28, respectively.

A beam dividing mirror 3' is positioned between focal plane 13' and transmit/receive unit 2 for deflecting a fraction of the power of the local energy spectrum along a third optical path in the direction of a two-dimensional, position sensitive photodiode 10 which is connected to two evaluation amplifiers 29 and 30 for producing displacement signals $\alpha_{actual}$ and $\beta_{actual}$ in response to currents $I_1$, $I_2$, $I_3$ and $I_4$, which currents are also summed in a summation amplifier 31. Two-dimensional, position sensitive photodiodes for example are well known by catalogue Hamamatsu photronics K.K., Idino-cho, Japan, published Sep. 1990, page 8. The amplifiers 29 and 30 may be of the class MC34071 Motorola, or CA 3130RCA, or Texas OP27. The displacement signals $\alpha_{actual}$ and $\beta_{actual}$ are characterized as $$\alpha = f\left(\frac{I_2 - I_1}{I_2 + I_1}\right) \text{ and } \beta = \left(\frac{I_4 - I_3}{I_4 + I_3}\right).$$

Figures 1, 5A:
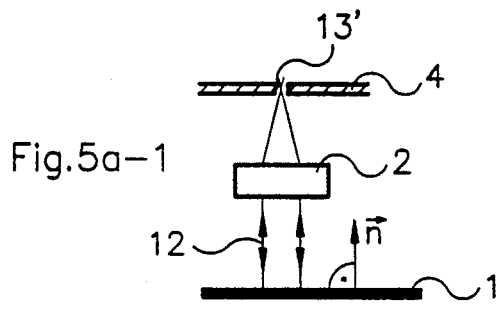
Figures 1, 5B:
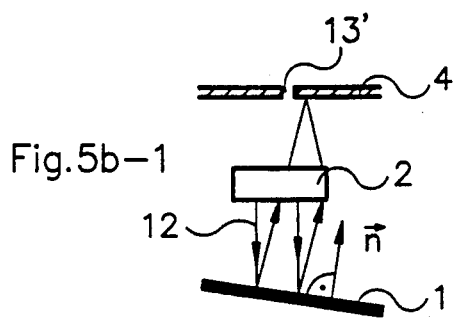
Figures 2, 5A:
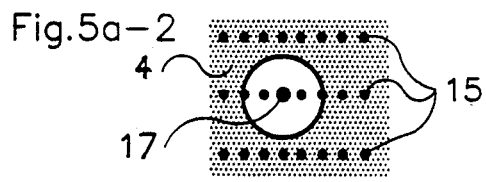
Figures 2, 5B:
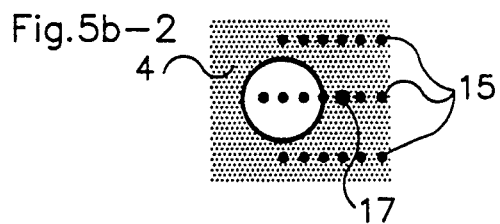

In operation, if semiconductor surface 1 is inclined too much and $\alpha=0$, $\beta=0$, local frequency spectrum 15 is displaced laterally in focal plane 13'. This may cause the zero order diffraction 17 (see also FIGS. 5b-1 to 5b-3) to no longer pass through the opening in filter aperture plate 4 which, however, is undesirable with respect to the output signal of the photodiodes. After a light energy specific fraction is coupled out of the local frequency spectrum 15 by way of beam divider mirror 3', the lateral displacement is directed onto two-dimensional, position sensitive photodiode 10 in order to reproduce the same image of the local frequency spectrum 15 on position sensitive photodiode 10. The plane of beam divider mirror 3', insofar as its operation is still ensured, may have any desired position. In the two subsequently connected evaluation amplifiers 29 and 30, the lateral displacement is determined by $\alpha_{actual}$ and $\beta_{actual}$ signals and which are fed to the respective electronic control units 28 and 27. The electronic control units each determine the differences between a desired value and the actual value and then feed a corresponding adjustment value to the respective actuator 26 or 25 which then displaces deflection mirror 9 until the zero order diffraction 17 lies in the center of the opening of filter aperture plate 4.

The output of summation amplifier 31 is fed to an electronic control unit 24 for actuating laser beam source 7 in order to maintain the output signal of the 5 photodiodes almost constant even if there are considerable fluctuations in the degree of reflection on semiconductor surface 1. This is accomplished by the electronic control unit 24 which determines a possible difference between a desired value of the total current of two-dimensional, position sensitive photodiode 10 and the actual value output by summation amplifier 31, and then uses this difference as an adjustment value to adjust laser beam source 7.

The fourth and last additional detail in FIG. 4 is the splitting of photodiode 6 shown in FIG. 1 into several individual diodes (l, . . . , n), here, for example, four photodiodes 6' to $6^{IV}$ whose outputs are each connected with an amplifier 22' to $22^{IV}$. The individual diodes may be constituted by a photodiode array or CCD array having separated photosensitive surfaces arranged so that the bar code can be simultaneously detected on separate scan traces, after passing the beam through filter aperture plate 4 and the focusing lens 23. This configuration thus permits the simultaneous multi-track scanning of bar code 14 during one scanning process.

FIG. 5 shows possible displacements of the Fourier spectrum 15 and the effect of a correction or displacement back into the "ideal position". Referring to FIGS. 5a-1 to 5a-3, the transmitted beam 12 extends parallel to the surface normal n of semiconductor surface 1. In this way, it is ensured that the zero order diffraction 17 lies in the center of the opening of filter aperture plate 4. In contrast thereto, FIG. 5b-1 shows an inclined surface normal n relative to transmitted beam 12 and it can be seen clearly in FIG. 5b-2 that the zero order diffraction 17 lies outside of the opening of filter aperture plate 4. This means that the detection signal 21 (FIG. 5b-3) is reversed at the output of photodiode 6 which, however, is unfavorable for the subsequently connected evaluation unit.

Figures 3, 5A:
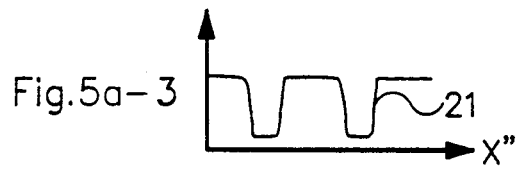
Figures 3, 5B:
Figures 1, 2, 3, 5C:
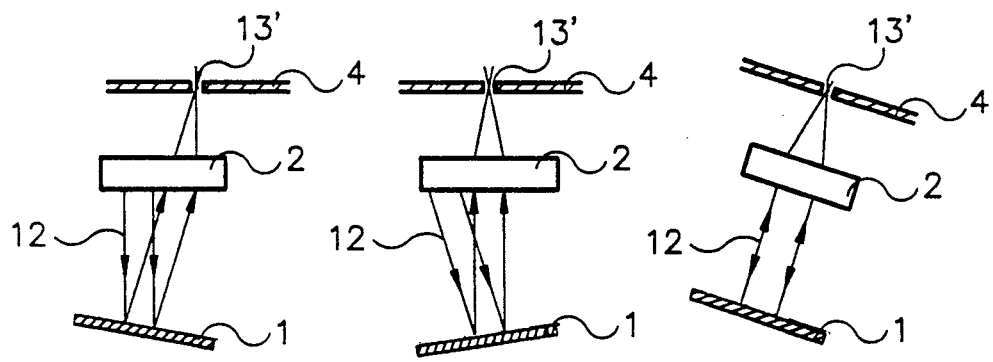

FIGS. 5c-1 to 5c-3 show three possibilities for correcting the position of the zero order diffraction 17 so that it comes to lie in the center of the opening of filter aperture plate 4. In FIG. 5c-1, filter aperture plate 4 is displaced for the purpose of correction. In FIG. 5c-2, the pivoting of deflection mirror 9 shown in FIG. 4 is indicated and in FIG. 5c-3, the follow-up of the complete sensor housing 11 is shown. The aperture (usable optical area) of optical transmit/receive unit 2 here determines an angle range for pivoting of a surface normal of the semiconductor surface 1.

Obviously, numerous and additional modifications and variations of the present invention are possible in light of the above teachings. It is therefore to be understood that within the scope of the appended claims, the invention may be practiced otherwise than as specifically claimed.

What is claimed is:

1. A device for a reading bar code applied to a surface of a semiconductor wafer, comprising:
    a laser beam source for producing a coherent diverging light beam along a first optical path;
    optical transmit/receive means having a first focal point on said first optical path upstream of said optical transmit/receive means for producing collimated light downstream thereof;
    focussing means for focussing the coherent diverging light beam into the first focal point of said optical transmit/receive means so that a parallel light beam having a planar wavefront is created downstream of said optical transmit/receive means for scanning a semiconductor surface having a bar code thereon;
    a beam divider mirror disposed optically between said transmit/receive means and the first focal point for allowing the light beam from said laser beam source to pass through said transmit/receive means and for allowing light reflected from the semiconductor surface through the transmit/receive means to pass into a second focal point of said transmit/receive means on a second optical path and on toward an image plane of said transmit/receive means on said second optical path for imaging the bar code;
    first aperture means for creating a first aperture in a focal plane of said transmit/receive means at the second focal point, with diffracted light from the bar code creating a local frequency spectrum in the focal plane at the second focal point having its zero order diffraction component in the center of the first aperture;
    a photosensitive light receiver; and
    second aperture means for creating a second aperture in the bar code image plane spatially in front of said photosensitive light receiver.

2. A device as defined in claim 1, wherein said transmit/receive means has a central axis and the first aperture is a circular aperture having a center on the central axis of said transmit/receive means and having a predetermined diameter, and the second aperture is a rectangular aperture with a ratio of narrow side to broadside in a range of 1:40 to 1:80, this ratio being determined by the geometry of the bar code on the semiconductor surface and an imaging scale of said optical transmit/receive means.

3. A device as defined in claim 2, wherein the bar code has a longitudinal direction and the broadside of the second aperture is disposed parallel to the longitudinal direction of the bar code.

4. A device as defined in claim 1, further comprising:
    a deflection mirror disposed on said first optical path downstream of said focussing means and upstream of said beam divider mirror for deflecting the light beam from said focussing means toward said beam divider mirror, said beam divider mirror deflecting the light beam from said deflecting mirror toward said optical transmit/receive means and transmitting the diffracted light from the bar code toward said first aperture;
    correction means for automatic correction of a lateral displacement of the zero order diffraction component of the local frequency spectrum including:
    a second beam divider mirror disposed between the first aperture and said optical transmit/receive means for directing a fraction of the power of the local frequency spectrum onto a third optical path;
    a two-dimensional, position sensitive photodiode disposed on the third optical path for producing output currents corresponding to a lateral displacement of the zero order diffraction component from a desired position on said two-dimensional, position sensitive photodiode which corresponds to a desired position of the first aperture relative to the first order diffraction component;

two evaluation amplifiers coupled for receiving the output currents of said two-dimensional, position sensitive photodiode, each said evaluation amplifier outputting an actual displacement signal corresponding to the lateral displacement of the zero order diffraction component in one of the two-dimensions of said two-dimensional, position sensitive photodiode;

control means for receiving the actual displacement signals from said two evaluation amplifiers and for producing two control signals each corresponding a difference between one of said actual displacement signals and a respective desired displacement signal in one of the two dimensions of displacement of said deflection mirror; and actuator means connected to said control means and to said deflection mirror for actuating displacement of said deflection mirror in two dimensions in response to the respective control signals from said control means.

5. A device as defined in claim 4, wherein said deflection mirror is freely movable about two mutually perpendicular rotation axes having respective rotation angles $\alpha$ and $\beta$, with the point of intersection of the two rotation axes lying in a second image plane of said optical transmit/receiver means located on the first optical path.

6. A device as defined in claim 1, wherein said optical transmit/receiver means has an aperture which determines an angle range for pivoting of a surface normal of the semiconductor surface.

7. A device as defined in claim 1, wherein said laser beam source comprises a laser diode which emits light of a sufficient coherence length in a wavelength range that lies outside of the wavelength range of 3000 to 6000 angstroms.

8. A device as defined in claim 1, wherein said photosensitive light receiver comprises a large-area PIN diode based on silicon.

9. A device as defined in claim 1, wherein said photosensitive light receiver comprises either a photodiode array or CCD array having separated photosensitive surfaces arranged for simultaneously detecting the bar code on separate scan traces.

10. A device as defined in claim 1, wherein said photosensitive light receiver comprises a large area PN diode based on silicon.

* * * * *